US008559824B2

(12) United States Patent
McColloch et al.

(10) Patent No.: US 8,559,824 B2
(45) Date of Patent: Oct. 15, 2013

(54) PARALLEL OPTICAL TRANSCEIVER MODULE HAVING A BALANCED LASER DRIVER ARRANGEMENT

(75) Inventors: Laurence R. McColloch, Santa Clara, CA (US); Frederick W. Miller, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 792 days.

(21) Appl. No.: 12/241,771

(22) Filed: Sep. 30, 2008

(65) Prior Publication Data

US 2010/0080567 A1 Apr. 1, 2010

(51) Int. Cl.
*H04B 10/00* (2013.01)
*H01S 5/42* (2006.01)

(52) U.S. Cl.
USPC ........... 398/135; 398/136; 398/137; 398/138; 398/139; 398/182; 398/195; 398/197; 372/50.12; 372/50.122; 372/50.124; 372/38.02

(58) Field of Classification Search
USPC .......... 398/182, 195, 197; 372/51.12, 51.122, 372/38.02, 51.124
See application file for complete search history.

(56) References Cited

U.S. PATENT DOCUMENTS

| 5,781,682 | A  | * | 7/1998 | Cohen et al. | ................. 385/89 |
| 6,859,470 | B2 | * | 2/2005 | Fu et al. | ................. 372/34 |
| 7,496,122 | B2 | * | 2/2009 | Bozso et al. | ................. 372/38.02 |
| 2002/0003231 | A1 | * | 1/2002 | Sun et al. | ................. 257/59 |
| 2002/0064193 | A1 |   | 5/2002 | Diaz | |
| 2003/0113073 | A1 |   | 6/2003 | Cheng | |
| 2003/0201462 | A1 |   | 10/2003 | Pommer et al. | |
| 2005/0135732 | A1 | * | 6/2005 | Crow et al. | ................. 385/15 |

FOREIGN PATENT DOCUMENTS

JP 2008076935 4/2008

* cited by examiner

*Primary Examiner* — Jessica Stultz
*Assistant Examiner* — Michael Carter (57) ABSTRACT

A parallel optical transceiver module is provided that has a balanced laser driver arrangement. The balanced laser driver arrangement of the invention includes at least two laser diode driver ICs, which preferably are located on opposite sides of a laser diode IC. Each laser diode driver IC drives a subset (e.g., half) of the total number of laser diodes of the laser diode IC. Because each laser diode driver IC drives a subset of the total number of laser diodes of the laser diode IC, the pitch (i.e., distance) between the high-speed signal pathways within the laser diode driver ICs can be increased. Increasing the pitch between the high-speed signal pathways provides several advantages, including, for example, reducing the potential for electrical cross-talk and inductive coupling between adjacent wire bonds that connect the output driver pads on the driver IC to the respective input pads on the laser diode IC.

20 Claims, 6 Drawing Sheets

PARALLEL OPTICAL TRANSCEIVER MODULE HAVING A BALANCED LASER DRIVER ARRANGEMENT

TECHNICAL FIELD OF THE INVENTION

The invention relates to optical communications systems. More particularly, the invention relates to parallel optical transceiver modules for simultaneously transmitting and/or receiving multiple optical signals over multiple optical channels.

BACKGROUND OF THE INVENTION

Figure 1:
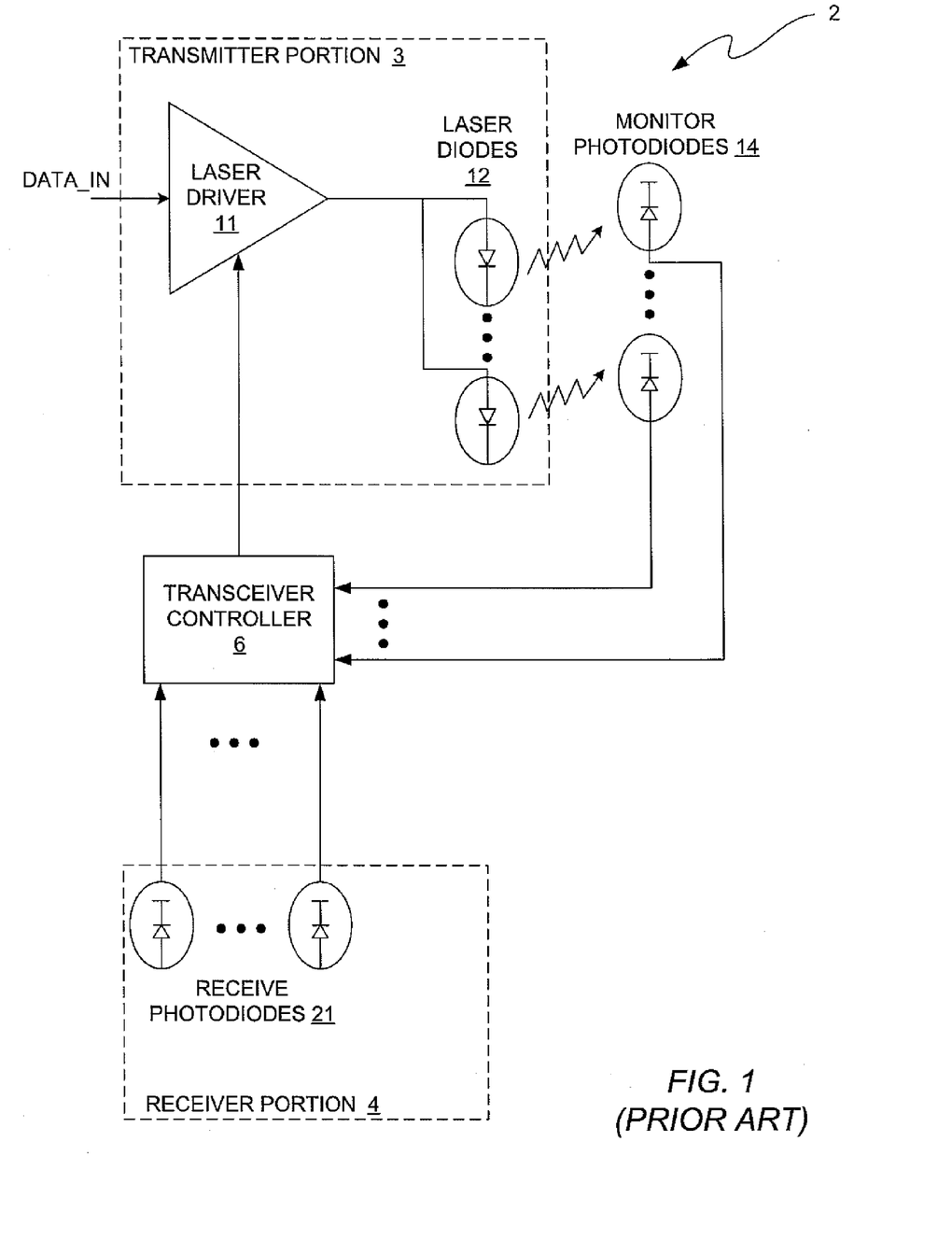
FIG. 1 illustrates a block diagram of a known parallel optical transceiver module currently used in optical communications.

FIG. 1 illustrates a block diagram of a parallel transceiver module 2 currently used in optical communications, which has multiple transmit and receive channels. The transceiver module 2 includes a transmitter portion 3 a receiver portion 4. The transmitter and receiver portions 3 and 4 are controlled by a transceiver controller 6. The transmitter portion 3 comprises components for transmitting data in the form of amplitude modulated optical signals over multiple optical fibers (not shown). The transmitter portion includes a laser driver 11 and a plurality of laser diodes 12. The laser driver 11 outputs electrical signals to the laser diodes 12 to modulate them. When the laser diodes 12 are modulated, they output optical signals that have power levels corresponding to logic 1s and logic 0s. An optics system (not shown) of the transceiver module 2 focuses the optical signals produced by the laser diodes 12 into the ends of respective transmit optical fibers (not shown) held within a connector (not shown) that mates with the transceiver module.

Typically, a plurality of monitor photodiodes 14 monitor the output power levels of the respective laser diodes 12 and produce respective electrical feedback signals that are fed back to the transceiver controller 6, which processes them to obtain respective average output power levels for the respective laser diodes 12. The controller 6 outputs control signals to the laser driver 11 that cause the laser driver 11 to adjust the bias current signals output to the respective laser diodes 12 such that the average output power levels of the laser diodes are maintained at relatively constant levels.

The receiver portion 4 includes a plurality of receive photodiodes 21 that receive incoming optical signals output from the ends of respective receive optical fibers (not shown) held in the connector. The optics system (not shown) of the transceiver module 2 focuses the light output from the ends of the receive optical fibers onto the respective receive photodiodes 21. The receive photodiodes 21 convert the incoming optical signals into electrical analog signals. The transceiver controller 6 and/or other circuitry (not shown) of the transceiver module 2 processes the electrical signals to recover the data represented by the signals.

Figure 2:
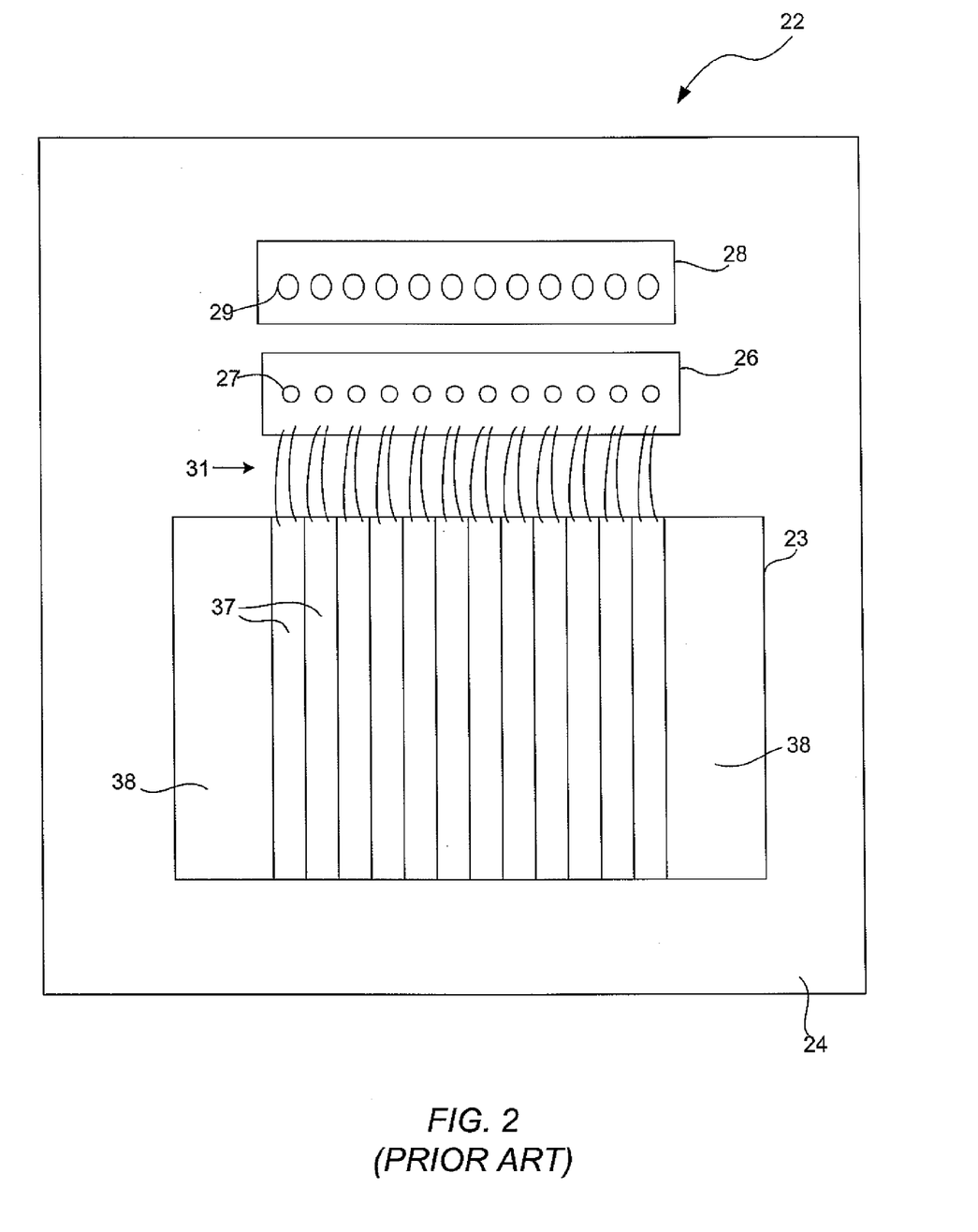
FIG. 2 illustrates a top view of a layout for a known parallel optical transmitter module of the type shown in FIG. 1.

FIG. 2 illustrates a top view of a layout of a known parallel optical transmitter module of the type commonly used in the optical communications industry for simultaneously transmitting optical data signals over multiple optical transmit channels. The parallel optical transmitter module 22 shown in FIG. 2 has twelve optical transmit channels and zero optical receive channels. The module 2 includes a laser diode driver integrated circuit (IC) 23, a laser diode IC 26, a monitor photodiode IC 28, and a flex circuit 24. The driver IC 23 and the monitor photodiode IC 28 are mounted on opposite sides of the laser diode IC 26. This arrangement allows the driver IC 23 and the monitor photodiode IC 28 to be in close proximity to the laser diode IC 26, which has the following advantages. The wire bonds 31 that deliver the high-speed electrical signals from the driver IC 23 to the laser diode IC 26 should be relatively short so that the wire bonds contribute very little resistive loss, inductive coupling and electrical cross-talk. However, the driver IC 23 generates a relatively large amount of heat. Therefore, the wire bonds 31 should not be so short that heat generated by the driver IC 23 detrimentally affects the performance of the laser diode IC 26. The monitor photodiode IC 28 should be very close to the laser diode IC 26 in order to reduce optical cross-talk between adjacent photodiodes 29 and to allow the sizes of the photodiodes 29 to be kept relatively small, which reduces costs. Locating the ICs 23 and 28 on opposite sides of the laser diode IC 26 in the manner depicted in FIG. 2 generally enables these goals to be achieved.

Each of the ICs 23, 26 and 28 includes electrical contacts (not shown) that are electrically connected to electrical contacts (not shown) on the flex circuit 24. Only a portion of the flex circuit 24 is shown in FIG. 2. The flex circuit 24 extends downward in the module 22 in the direction toward the bottom of the sheet that contains FIG. 2, wraps around a surface (not shown) in the module 22, and then extends in a direction that is generally into the plane of the sheet containing FIG. 2. A portion of the flex circuit 24 located on the end that extends in this latter direction is electrically interconnected with electrical contacts on an upper surface of a ball grid array (BGA) (not shown).

One of the disadvantages of parallel optical transmitter modules of the type depicted in FIG. 2 is that the signal pathways that carry the high speed signals that drive the laser diodes of the laser diode IC 26 are extremely long. Each high speed signal pathway that delivers an electrical signal for driving one of the laser diodes 27 extends generally from the location where the corresponding electrical contact on the flex circuit 24 comes into contact with the corresponding electrical contact on the BGA to the location where the associated wire bond 31 comes into electrical contact with the laser diode IC 26. Thus, each of these high speed signal pathways generally has the following route: (1) through the flex circuit 24 from the corresponding electrical contact point on the BGA to the lower edge of the driver IC 23 (2) from the lower edge of the driver IC 23 to the upper edge of the driver IC 23, and (3) from the upper edge of the driver IC 23 to the lower edge of the laser diode IC 26. The high-speed signal pathways in the driver IC 23 that carry the signals for driving the laser diodes 27 are represented in FIG. 2 by numeral 37. The relatively low-speed control signals used by the driver IC 23 are typically carried in the regions of the IC 23 represented in FIG. 2 by numeral 38.

The extremely long lengths of the high speed signal pathways 37 often leads to undesired effects, such as, for example, cross-talk between adjacent signal path conductors, energy dissipation due to path losses associated with the electrical resistance of the pathway conductors, and relatively large signal path inductances caused by inductive coupling between adjacent signal pathway conductors. One or more of these undesirable effects can degrade signal integrity.

Another disadvantage of the parallel optical transmitter module 22 shown in FIG. 2 is that the pathways 37 through the driver IC 23 are extremely close together, which makes it impractical and/or extremely difficult to include elements in the pathways 37 other than the signal pathway conductive traces themselves and the transistors located along the pathways for providing the signals with the appropriate drive strength for driving the respective laser diodes 27. The distance between the pathways 37 is driven primarily by the distance between the centers of the cores of the optical fibers of the optical fiber ribbon cables (not shown) that are used with transmitter modules. This distance is typically referred to as "pitch". The standard pitch for optical fiber ribbon cables is 250 micrometers (microns), which is also the standard pitch for the high-speed signal pathways of the transmitter modules of the type shown in FIG. 2.

One of the disadvantages associated with using this standard pitch for the high-speed signal pathways is that it can result in the aforementioned problems of cross-talk, resistive path loss and inductive coupling, which can degrade signal integrity. However, in order to increase the pitch between the high-speed signal pathways 37, the driver IC 23 would need to be significantly increased in width, which would also create a need to increase the width of the laser diode IC 26 and/or of the lengths of the wire bonds 31. If the width of the laser diode IC 26 is increased, the width of the monitor photodiode IC 28 would generally also need to be increased to maintain the optical relationship between each laser diode 27 and its respective monitor photodiode 29. Increasing the lengths of the wire bonds 31 may result in an increase in the risk of cross-talk, resistive path loss and inductive coupling problems. Increasing the width of the driver IC 23 and/or of the ICs 26 and 28 would generally result in an increase in the cost of the module 22.

A need exists for a parallel optical transmitter, receiver, or transceiver module in which the lengths of the high-speed signal pathways are significantly reduced without increasing the overall size and cost of the module.

SUMMARY OF THE INVENTION

The invention is directed to a parallel optical transceiver module having a balanced laser diode driver configuration. The parallel optical transceiver module comprises a circuit board, a laser diode IC mounted on the upper surface of the circuit board, a first laser diode driver IC mounted on the upper surface of the circuit board, a second laser diode driver IC mounted on the upper surface of the circuit board, and first and second sets of conductors for delivering electrical laser diode driving signals from the first and second driver ICs, respectively, to the laser diode IC. The laser diode IC comprises N laser diodes configured to generate N respective optical signals, wherein N is an integer that is equal to or greater than 2. The first laser diode driver IC has driver circuitry configured to drive L of the N laser diodes, wherein L is an integer that is less than N and greater than or equal to 1. The second laser diode driver IC has driver circuitry configured to drive M of the N laser diodes, wherein M is an integer that is less than N and greater than or equal to 1. Each of the conductors of the first set has a first end that is connected to a respective electrical contact on the first laser diode driver IC and a second end that is connected to a respective electrical contact on the laser diode IC. Each of the conductors of the second set has a first end that is connected to a respective electrical contact on the second laser diode driver IC and a second end that is connected to a respective electrical contact on the laser diode IC.

The invention also provides a method for simultaneously transmitting multiple optical signals over multiple respective optical transmit channels in a parallel optical transceiver module. The method comprises causing first and second sets of electrical laser diode driver signals to be sent over first and second sets of conductors of first and second laser diode driver ICs, respectively, to a laser diode IC. The laser diode IC comprises N laser diodes configured to generate N respective optical signals, wherein N is an integer that is equal to or greater than 2. The first laser diode driver IC has driver circuitry configured to drive L of the N laser diodes, wherein L is an integer that is less than N and greater than or equal to 1. The second laser diode driver IC has driver circuitry configured to drive M of the N laser diodes, wherein M is an integer that is less than N and greater than or equal to 1. The first and second sets of electrical laser diode driver signals sent over the first and second sets of conductors from the first and second laser diode driver ICs to the laser diode IC cause the N laser diodes of the laser diode IC to generate the N optical signals.

These and other features and advantages of the invention will become apparent from the following description, drawings and claims.

DETAILED DESCRIPTION OF AN ILLUSTRATIVE EMBODIMENT

In accordance with the invention, a parallel optical transceiver module is provided that has a balanced laser driver arrangement. The balanced laser driver arrangement of the invention includes at least two laser diode driver ICs, which preferably are located on opposite sides of a laser diode IC. Each laser diode driver IC drives a subset (e.g., half) of the total number of laser diodes of the laser diode IC. Because each laser diode driver IC drives a subset of the total number of laser diodes of the laser diode IC, the pitch (i.e., distance) between the high-speed signal pathways within the laser diode driver ICs can be increased. Increasing the pitch between the high-speed signal pathways provides several advantages. One advantage of the increased pitch is that it reduces the potential for electrical cross-talk and inductive coupling between adjacent wire bonds that connect the output driver pads on the driver IC to the respective input pads on the laser diode IC. Reducing the potential for electrical cross-talk and inductive coupling between these wire bonds helps ensure high signal integrity.

Another advantage of the increased pitch is that the reduced potential for electrical cross-talk and inductive coupling makes it possible to mount the driver IC in closer proximity to the laser diode IC than would otherwise be possible. Mounting the driver IC in closer proximity to the laser diode IC allows the lengths of the wire bonds between the driver IC and the laser diode IC to be reduced, which further reduces the potential for electrical cross-talk and inductive coupling between adjacent wire bonds.

Yet another advantage of the increased pitch is that it allows the monitor photodiodes to be integrated into the driver IC. Integrating the monitor photodiodes into the driver IC eliminates the need to have a separate monitor photodiode IC in the transceiver module. Eliminating the need for a separate monitor photodiode IC results in a more efficient utilization of space in the transceiver module, thereby enabling the module to be reduced in size relative to the aforementioned known transceiver module. In addition, eliminating the need for a separate monitor photodiode IC also results in fewer wire bonds and pin connections in the transceiver module, which reduces circuit complexity, power consumption, electrical cross-talk, and inductive coupling.

The term "transceiver module", as that term is used herein, is intended to denote any of the following: (1) a module configured to transmit and receive signals, (2) a module configured to transmit signals, but not receive signals, and (3) a module configured to receive signals, but not transmit signals. The transceiver module described herein with reference to the illustrative embodiment shown in FIGS. 3-6 is configured to transmit, but not receive, signals. Therefore, the transceiver module in accordance with this illustrative embodiment may also be thought of as a transmitter, or Tx, module as it has no receiver capability or functionality. It should be noted, however, that the transceiver module of the invention may instead be configured to receive, but not transmit, signals, in which case the module may be thought of as a receiver module, or Rx module. The transceiver module of the invention may also be configured to transmit and receive signals.

Figure 3:
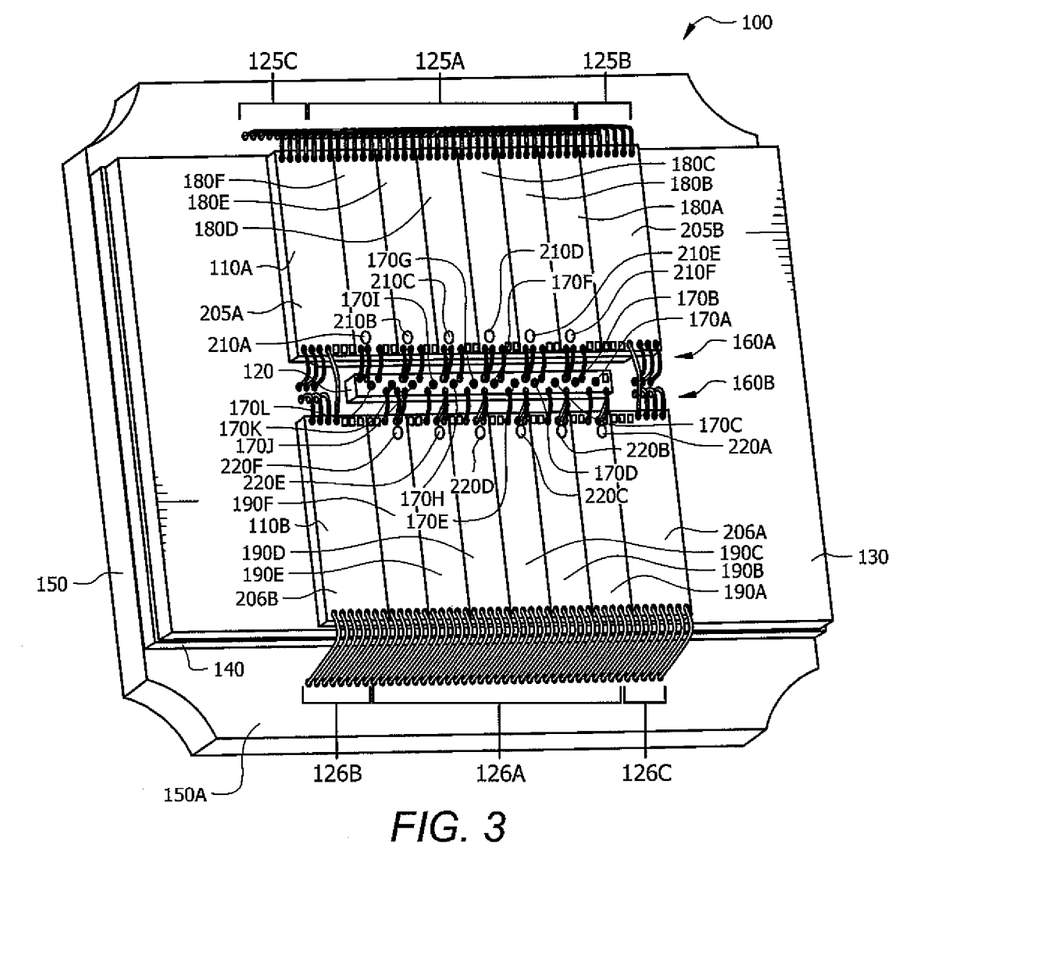
FIG. 3 illustrates a top perspective view of the parallel optical transceiver module of the invention in accordance with an embodiment.

FIG. 3 illustrates a top perspective view of the parallel optical transceiver module 100 in accordance with an embodiment, wherein the transceiver module 100 is configured as a Tx module to transmit, but not receive, optical signals. In FIG. 3, the optics system (FIG. 5) has been removed to enable the balanced driver arrangement to be more easily seen. The parallel optical transceiver module 100 includes first and second laser diode driver ICs 110A and 110B, respectively, a laser diode IC 120, a leadframe 130, and a PCB 150. The top surface 150A of the PCB 150 has electrical contacts (not shown) thereon that are electrically coupled via electrically conductive wire bonds 125 and 126 to electrical contact pads (not shown) on the driver ICs 110A and 110B, respectively. The leadframe 130 preferably is secured to the upper surface 150A of the PCB 150 with an adhesive, such as an epoxy. Electrical contacts on the PCB 150 are electrically connected to conductive pads (not shown) of a land grid array (LGA) (FIG. 4) by conductive lands of the LGA. The LGA and its electrical connections are described below in detail with reference to FIG. 4.

The driver ICs 110A and 110B each have a plurality of electrical driver contact pads that are connected by electrically conductive wire bonds 160A and 160B, respectively, to electrical contact pads of the laser diode IC 120. The laser diode IC 120 comprises an array of laser diodes 170A-170L, each of which is represented by an aperture formed in the upper surface of the laser diode IC 120. The invention is not limited to using any particular type of laser diode IC for this purpose. Vertical cavity surface emitting laser diodes (VCSELs) are particularly well suited for the arrangement shown in FIG. 3 due to their vertical surface light emitting characteristics. Also, although the invention is being described with reference only to laser diodes being used as the light sources, other types of light sources may be used for this purpose, such as light emitting diodes.

In accordance with this illustrative embodiment, the laser diode IC 120 has a total of twelve laser diodes 170A-170L. Each laser diode 170A-170L receives a low or zero volt ground or common signal provided over one of the wire bonds 160A or 160B and a varying data signal provided over another of the wire bonds 160A or 160B. The wire bonds labeled 160A provide the electrical connections between the driver IC 110A and the laser diode IC 120, whereas the wire bonds labeled 160B provide the electrical connections between the driver IC 110B and the laser diode IC 120. Respective electrical circuits (not shown) within the laser diode IC 120 are associated with each respective laser diode 170A-170L and perform the operations associated with modulating the respective laser diodes 170A-170L based on the potential difference between the respective low or zero volt signal and the respective data signal. Each of the laser diodes 170A-170L outputs a respective optical signal having an optical intensity level that depends on the respective voltage difference. The manner in which laser diodes are modulated by laser diode drivers is well known in the art. Therefore, a detailed description of the process and the circuitry that performs this process will not be elaborated on herein.

As indicated above, each of the laser diode driver ICs 110A and 110B drives a subset of the plurality of laser diodes 170A-170L. In accordance with the preferred embodiment, each of the laser diode driver ICs 110A and 110B drives half of the laser diodes 170A-170L such that the laser diodes are evenly distributed among the laser diode driver ICs 110A and 110B. In accordance with the illustrative embodiment shown in FIG. 3, there are a total of twelve laser diodes 170A-170L on the laser diode IC 120 and each of the driver ICs 110A and 110B drives six of the laser diodes 170A-170L. For example, for the laser diodes labeled 170A-170L from left to right with respect to the drawing sheet page containing FIG. 3, driver IC 110A drives laser diodes 170A, 170C, 170E, 170G, 170I, and 170K and driver IC 110B drives laser diodes 170B, 170D, 170F, 170H, 170J, and 170L.

The electrical signals that are sent over wire bonds 160A and 160B to drive the laser diodes 170A-170L of the laser diode IC 120 are relatively high-speed signals that are coupled into and out of the driver ICs 110A and 110B via wire bonds 125A and 126A, respectively. The electrical control signals and other relatively low-speed signals are coupled into and out of the driver ICs 110A and 110B via wire bonds 125B, 125C, 126B, and 126C. The high-speed signal pathways of driver IC 110A are represented in FIG. 3 by the numerals 180A-180F. The high-speed signal pathways of driver IC 110B are represented in FIG. 3 by the numerals 190A-190F. The low-speed signal pathways of driver IC 110A are represented in FIG. 3 by the numerals 205A and 205B. The low-speed signal pathways of driver IC 110B are represented in FIG. 3 by the numerals 206A and 206B.

As indicated above, using two driver ICs 110A and 110B that are positioned symmetrically with respect to the position of the laser diode IC 120 enables the pitch, or distance, between adjacent conductors (not shown) of the high-speed signal pathways 180A-180F and 190A-190F to be dramatically increased compared to the pitch that is provided using a single driver IC to drive all of the laser diodes in the aforementioned known parallel transceiver module shown in FIG. 2. In essence, the increased pitch is made possible through the use of the two driver ICs 110A and 110B and the symmetrical, or balanced, arrangement of the driver ICs 110A and 110B relative to the laser diode IC 120. In general, the increased pitch is about twice that of the arrangement described above with reference to FIG. 2. The increased pitch of the balanced driver arrangement shown in FIG. 3 enables monitor photodiodes 210A-210F and 220A-220F to be integrated into the driver ICs 110A and 110B, respectively. The high-speed signals associated with the monitor photodiodes 210A-210F and 220A-220F are also carried on the high-speed signal pathways 180A-180F and 190A-190F, but on different conductors (not shown) than those which carry the high-speed signals associated with driving the laser diodes 170. The low-speed signals associated with the monitor photodiodes 210A-210F and 220A-220F are carried on the signal pathways 205A, 205B, 206A, and 206B.

Integrating the monitor photodiodes 210A-210F in the driver IC 110A and integrating the monitor photodiodes 220A-220F in the driver IC 110B lowers the overall cost of the transceiver module 100 and reduces the overall size of the module 100. Additionally, the increased space inside of the high-speed signal pathways 180A-180F and 190A-190F enables respective amplifier circuits (not shown) for the respective integrated photodiodes 210A-210F and 220A-220F to be placed in very close proximity to the photodiodes inside of the driver ICs 110A and 110B. Placing the amplifier circuits in very close proximity to the photodiodes enables the photodiodes to monitor light of lower intensity levels, which reduces the potential for optical cross-talk and other types of optical noise. In addition, the increased pitch, which may be, for example, 500 microns, enables larger monitor photodiodes to be used for this purpose, which results in less stringent tolerance requirements for the optics system and for optical alignment mechanisms that are used to ensure that the laser diodes, the photodiodes, the lenses, etc., are optically aligned. The resulting less stringent tolerance requirements generally lead to lower manufacturing costs and higher manufacturing yield.

Figure 4:
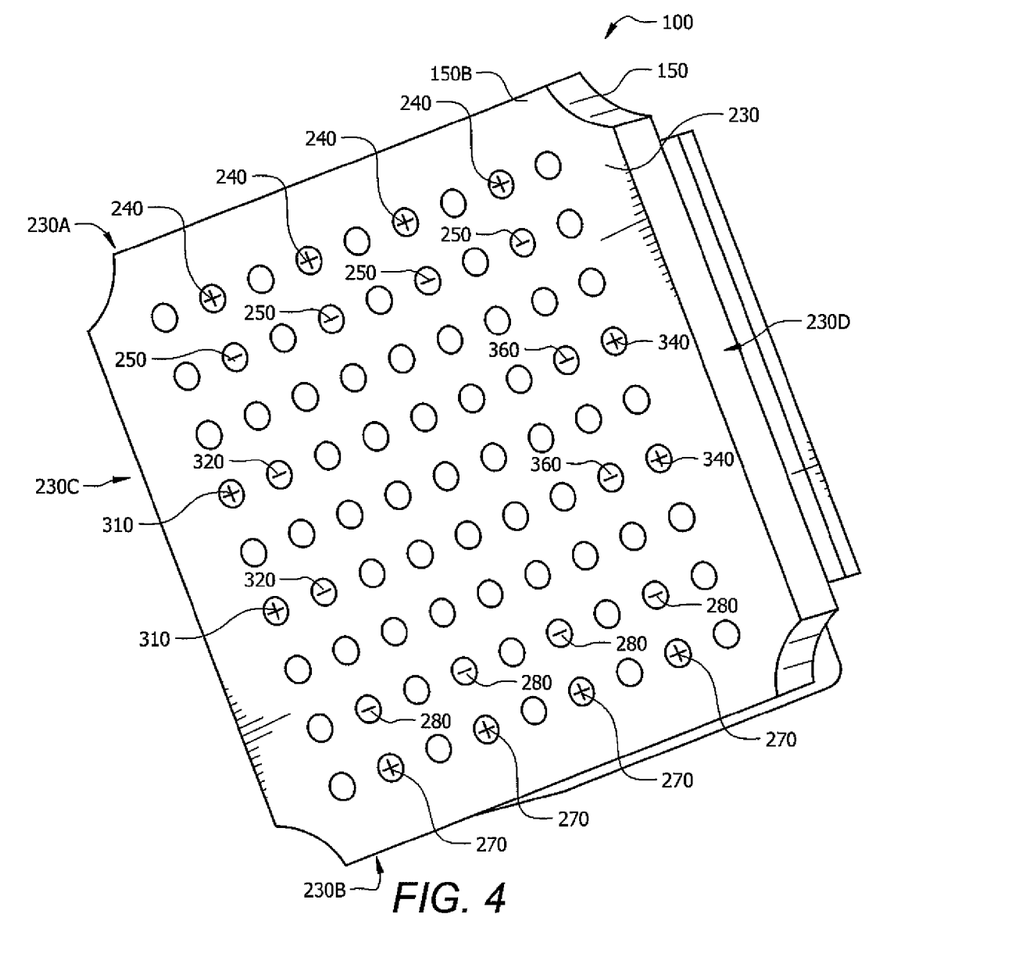
FIG. 4 illustrates a bottom perspective view of the optical parallel transceiver module shown in FIG. 3, which shows the land grid array (LGA) bottom surface of the PCB of the module shown in FIG. 3.

FIG. 4 illustrates a bottom perspective view of the optical parallel transceiver module 100 shown in FIG. 3. The bottom surface 150B of the PCB 150 typically comprises, or is secured to, an LGA surface 230. In accordance with the preferred embodiment, the wire bonds 125A and 126A that provide the electrical connections between the conductors of the high-speed signal pathways 180A-180F and 190A-190F and the electrical contacts on the PCB 150 are electrically connected to contacts on the periphery of the LGA surface 230. The wire bonds 125B, 125C, 126B and 126C that provide the electrical connections between the conductors of the low-speed signal pathways 205A, 205B, 206A and 206B and the electrical contacts on the PCB 150 are electrically connected to contacts in the center region of the LGA surface 230.

The routing of conductive traces in the PCB 150 to the center of the LGA surface 230 is typically more difficult than the routing of conductive traces in the PCB 150 to the periphery of the LGA surface 230. Therefore, placing the connections for the lower-speed signals in the center of the LGA 230 allows less difficult, more direct routing to be used for the high-speed signals. It is very important for the lengths of the high-speed signal pathways to be equal in order to avoid signal skew problems (i.e., signals on different channels arriving at different times). Using the less difficult and more direct routes to the periphery of the LGA surface 230 for the high-speed signals helps ensure that these pathways will be equal in length. In addition, because the pathway lengths for signals that are routed to the center of the LGA surface 230 are longer than the pathway lengths for signals that are routed to the periphery of the LGA surface 230, the shorter routes are reserved for the high-speed signal pathways. This helps reduce the potential for electrical cross-talk and inductive coupling between the high-speed signal pathways and to reduce resistive loss associated with the high-speed signal pathways.

With reference to peripheral edge 230A of the LGA surface 230, the "+" signs in the openings 240 of the LGA surface 230 correspond to locations where electrical connections are made between ends of the wire bonds 125A and electrical contacts of the LGA surface 230. These connections are associated with the conductors of the high-speed pathways 180B, 180C, 180D and 180E (FIG. 3) of the driver IC 110A that carry the data signals that drive the laser diodes 170C, 170E, 170G, and 170I, respectively. The "−" signs in the openings 250 of the LGA surface 230 along edge 230A also correspond to locations where electrical connections are made between ends of the wire bonds 125A and electrical contacts of the LGA surface 230. However, the connections in openings 250 are associated with the conductors of the high-speed pathways 180B, 180C, 180D and 180E of the driver IC 110A that provide the ground, or common, voltage level to the laser diodes 170C, 170E, 170G, and 170I, respectively. It should be noted that the ones of the wire bonds 160A and 160B that provide the low voltage signals to the laser diodes 170A-170L may be doubled to essentially half the inductance associated with these wire bonds, thereby further reducing the possibility of inductive coupling and cross-talk.

With reference to peripheral edge 230B of the LGA surface 230, the "+" signs in the openings 270 of the LGA surface 230 correspond to locations where electrical connections are made between ends of the wire bonds 126A (FIG. 3) and electrical contacts of the LGA surface 230. These connections are associated with the conductors of the high-speed pathways 190B, 190C, 190D, and 190E (FIG. 3) that carry the data signals that drive the laser diodes 170D, 170F, 170H, and 170J, respectively. The "−" signs in the openings 280 of the LGA surface 230 along edge 230B are associated with the conductors of the high-speed pathways 190B, 190C, 190D, and 190E that provide the ground, or common, voltage level to the laser diodes 170D, 170F, 170H, and 170J, respectively.

With reference to peripheral edge 230C of the LGA surface 230, the "+" signs in the openings 310 of the LGA surface 230 correspond to locations where electrical connections are made between ends of the wire bonds 125A, 126A and electrical contacts of the LGA surface 230. These connections are associated with the conductors of the high-speed pathways 180A and 190A of the driver ICs 110A and 110B, respectively, that carry the data signals that drive the laser diodes 170A and 170B, respectively. The "−" signs in the openings 320 of the LGA surface 230 along edge 230C are associated with the conductors of the high-speed pathways 180A and 190A of the driver ICs 110A and 110B, respectively, that provide the ground, or common, voltage level to the laser diodes 170A and 170B, respectively.

With reference to peripheral edge 230D of the LGA surface 230, the "+" signs in the openings 340 of the LGA surface 230 correspond to locations where electrical connections are made between ends of the wire bonds 125A, 126A and electrical contacts of the LGA surface 230. These connections are associated with the conductors of the high-speed pathways 180F and 190F of the driver ICs 110A and 110B, respectively, that carry the data signals that drive the laser diodes 170K and 170L, respectively. The "−" signs in the openings 360 of the LGA surface 230 along edge 230D are associated with the conductors of the high-speed pathways 180F and 190F of the driver ICs 110A and 110B, respectively, that provide the ground, or common, voltage level to the laser diodes 170K and 170L, respectively.

It is readily apparent from the foregoing description of FIG. 4 that the routing of the high-speed signal pathways from the LGA surface 230 to the laser diodes 170A-170L is symmetrical relative to the laser diode IC 120. While the high-speed signal pathways are symmetrical relative to the laser diode IC 120, the pathways do not all run parallel to each other side-by-side. For example, the pathways 180A-180F do not run along side the pathways 190A-190F. In addition, routing these pathways to the periphery of the LGA surface 230 helps to reduce the path lengths while keeping the pathway lengths equal, or as nearly equal as possible. The combination of these routing characteristics for the high-speed signals helps to ensure high signal integrity by reducing cross-talk, inductive coupling and skew issues. These advantages would be very difficult to achieve using a single driver IC due to the fact that all of the high-speed pathways are normally routed from the same edge of the single driver IC, run in parallel for long lengths, and are in very close proximity to one another, which results in a greater potential electrical cross-talk and inductive coupling between the pathways.

In addition, as described above, all of these advantages of the invention are achieved without the size of the module having to be increased. For example, the module 100 may be approximately 8 millimeters (mm) by 8 mm in length and width, respectively, which corresponds to a footprint that is about 20% smaller than that of known parallel transceiver modules of the type described above with reference to FIG. 2 having an equal number of channels.

Figure 5:
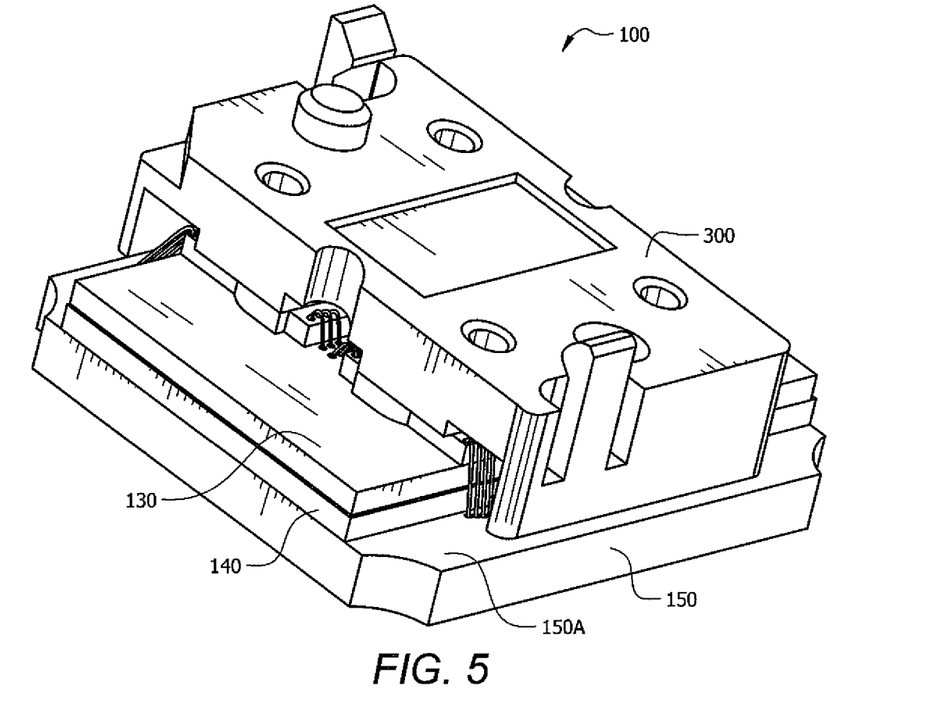
FIG. 5 illustrates a top perspective view of the transceiver module shown in FIGS. 3 and 4, but with the optics system secured to the top surface of the PCB of the transceiver module.

FIG. 5 illustrates a top perspective view of the transceiver module 100 shown in FIGS. 3 and 4 with the optics system 300 secured to the top surface 150A of the PCB 150. In accordance with the illustrative embodiment, the optics system 300 is configured to receive a 1×12 optical fiber ribbon cable (not shown) and includes optical elements for directing optical signals produced by the laser diodes 170A-170L into the ends of respective fibers of the ribbon cable for transmission over the fibers. The invention is not limited to any particular design for the optics system or with respect to the optical elements that are used to direct light produced by the laser diodes into the ends of the fibers. The invention also is not limited with respect to the type of optical fibers or number of optical fibers that are connected to the module 100.

Figure 6:
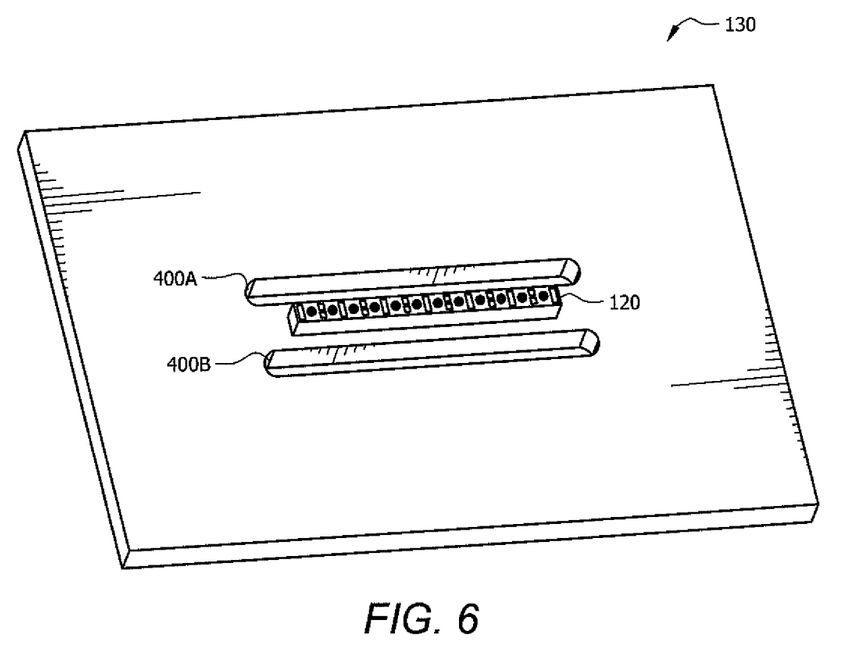
FIG. 6 illustrates a top perspective view of the leadframe of the transceiver module shown in FIG. 3 in accordance with an embodiment, wherein slots formed in the leadframe thermally isolate the driver ICs from the laser diode IC.

FIG. 6 illustrates a top perspective view of the leadframe 130 shown in FIG. 3 in accordance with an embodiment. In accordance with this embodiment, the leadframe 130 has two slots 400A and 400B formed in it that generally extend between the locations where the driver ICs 110A and 110B (FIG. 3) attach to the leadframe 130 and the location where the laser diode IC 120 attaches to the leadframe 130. For clarity, only the laser diode IC 120 is shown attached to the leadframe 130 in FIG. 6. In general, the driver ICs are the primary sources of heat in transceiver modules. For this reason, the driver IC is normally not placed in extremely close proximity to the laser diode IC because the heat generated by the driver IC can increase the temperature of the laser diodes, which can detrimentally affect their performance. However, placement of the driver IC too far from the laser diode IC means that the wire bonds that connect the driver IC to the laser diode IC must be relatively long, which can lead to cross-talk, inductive coupling and resistive loss issues.

The slots 400A and 400B formed in the leadframe 130 allow the driver ICs 110A and 110B to be placed in very close proximity to the laser diode IC 120. The slots 400A and 400B thermally isolate the laser diode IC 120 from the driver ICs 110A and 110B. In addition, the slots 400A and 400B allow the lengths of the wire bonds 160A and 160B that connect the driver ICs 110A and 110B, respectively, to the laser diode IC 120 to be very short, which reduces or eliminates the potential from cross-talk, inductive coupling and resistive loss caused by the wire bonds.

It should be noted that the invention has been described with respect to illustrative embodiments for the purpose of describing the principles and concepts of the invention. The invention is not limited to these embodiments. For example, while the invention has been described with reference to using a particular balanced driver layout with routing symmetry for the high-speed signal pathways, the invention is not limited to this particular layout. For example, the driver ICs 110A and 110B could be positioned asymmetrically relative to the position of the laser diode IC 120, although some of the advantages of a symmetrical layout, such as reductions in cross-talk and inductive coupling, for example, may be lost or lessened. Also, while the invention has been described with reference to a transceiver module in which all channels are transmit channels, the transceiver module may include transmit and receive channels or only receive channels. As will be understood by those skilled in the art in view of the description being provided herein, many modifications may be made to the embodiments described herein while still providing a parallel optical transceiver module that achieves the goals of the invention, and all such modifications are within the scope of the invention.

What is claimed is:

1. A parallel optical transceiver module for simultaneously transmitting multiple optical signals over multiple respective optical transmit channels, the optical transceiver module comprising:

a circuit board comprising a substrate having an upper surface and a lower surface, the upper and lower surfaces having electrical conductors disposed thereon, wherein at least some of the electrical conductors disposed on the upper surface are electrically connected with at least some of the electrical conductors disposed on the lower surface;

a leadframe mounted on the upper surface of the circuit board, the leadframe comprising an electrically conductive material;

a laser diode integrated circuit (IC) chip mounted on the leadframe, the laser diode IC chip comprising N laser diodes configured to generate N respective optical signals, wherein N is an integer that is equal to or greater than 2;

a first laser diode driver IC chip mounted on the leadframe, the first laser driver IC chip having driver circuitry configured to drive L of the N laser diodes, wherein L is an integer that is less than N and greater than or equal to 1;

a second laser diode driver IC chip mounted on the leadframe, the second laser driver IC chip having driver circuitry configured to drive M of the N laser diodes, wherein M is an integer that less than N and greater than or equal to 1;

a first set of conductors for delivering electrical laser diode driving signals from the first laser diode driver IC chip to the laser diode IC chip, each of the conductors of the first set having a first end that is connected to respective electrical contacts on the first laser diode driver IC chip and a second end that is connected to respective electrical contacts on the laser diode IC chip; and a second set of conductors for delivering electrical laser diode driving signals from the second laser diode driver IC chip to the laser diode IC chip, each of the conductors of the second set having a first end that is connected to a respective electrical contact on the second laser diode driver IC chip and a second end that is connected to a respective electrical contact on the laser diode IC chip, wherein the laser diode IC chip is located in between the first and second laser diode driver IC chips such that a first side of each of the first and second laser diode driver IC chips is proximate to first and second sides, respectively, of the laser diode IC chip to provide a symmetrical arrangement of the first and second laser diode driver IC chips relative to the laser diode IC chip, and wherein the leadframe has at least first and second slots that have been formed therein by removing portions of the electrically conductive material of the leadframe, the slots passing entirely through the leadframe from an upper surface of the leadframe through a lower surface of the leadframe, and wherein the first and second slots are located in between the first sides of the first and second laser diode driver IC chips and the first and second sides, respectively, of the laser diode IC chip.

2. A parallel optical transceiver module for simultaneously transmitting multiple optical signals over multiple respective optical transmit channels, the optical transceiver module comprising:

a circuit board comprising a substrate having an upper surface and a lower surface, the upper and lower surfaces of the substrate having electrical conductors disposed thereon, wherein at least some of the electrical conductors disposed on the upper surface of the substrate are electrically connected with at least some of the electrical conductors disposed on the lower surface of the substrate;

a laser diode integrated circuit (IC) chip mounted on the upper surface of the circuit board, the laser diode IC chip having at least a first side and a second side that are substantially parallel to one another, the laser diode IC chip comprising N laser diodes configured to generate N respective optical signals in a direction away from the upper surface of the circuit board, wherein N is an integer that is equal to or greater than 2;

a first laser diode driver IC chip mounted on the upper surface of the circuit board in electrical communication with the laser diode IC chip, the first laser diode IC chip having at least a first side and a second side that are substantially parallel to one another, the first side of the first laser diode IC chip being proximate to the first side of the laser diode IC chip, the first laser driver IC chip having driver circuitry configured to drive L of the N laser diodes, wherein L is an integer that is less than N and greater than or equal to 1;

a second laser diode driver IC chip mounted on the upper surface of the circuit board in electrical communication with the laser diode IC chip, the second laser diode IC chip having at least a first side and a second side that are substantially parallel to one another, the first side of the second laser diode IC chip being proximate to the second side of the laser diode IC chip, the second laser driver IC chip having driver circuitry configured to drive M of the N laser diodes, wherein M is an integer that is less than N and greater than or equal to 1, a first set of monitor photodiodes integrated in the first laser diode driver IC chip, the first set of monitor photodiodes comprising at least one monitor photodiode, said at least one monitor photodiode of the first set of monitor photodiodes being positioned in close proximity to the first side of the first laser diode driver IC chip; and a second set of monitor photodiodes integrated in the second laser diode driver IC chip, the second set of monitor photodiodes comprising at least one monitor photodiode, said at least one monitor photodiode of the second set of monitor photodiodes being positioned in close proximity to the first side of the second laser diode driver IC chip.

3. The parallel optical transceiver module of claim 2, wherein:

the first laser diode driver IC chip contains L number of first signal pathways configured in parallel running between the first side of the first laser diode driver IC chip and the second side of the first laser diode driver IC chip where each of the L number of first signal pathways is greater than 250 microns in width; and wherein the second laser diode driver IC chip contains M number of second signal pathways configured in parallel running between the first side of the second laser diode driver IC chip and the second side of the second laser diode driver IC chip where each of the M number of second signal pathways is greater than 250 microns in width.

4. The parallel optical transceiver module of claim 3, wherein each of the L number of first signal pathways is about 500 microns in width and each of the M number of second signal pathways is about 500 microns in width.

5. The parallel optical transceiver module of claim 3, wherein each of the L number of first signal pathways of the first laser diode driver IC chip is in communication with one of the L of the N laser diodes driven by the first laser driver IC chip, and each of the M number of second signal pathways of the second laser diode driver IC chip is in communication with one of the M of the N laser diodes driven by the second laser driver IC chip.

6. The parallel optical transceiver module of claim 3, wherein:

the first set of monitor photodiodes comprises L number of monitor photodiodes, and each of the L number of monitor photodiodes is located within one of the L number of first signal pathways of the first laser diode driver IC chip; and the second set of monitor photodiodes comprises M number of monitor photodiodes, and each of M number of monitor is located within one of the M number of second signal pathways of the second laser diode driver IC chip.

7. The parallel optical transceiver module of claim 6, further including:

an L number of first amplifier circuits integrated in the first laser diode driver IC chip, each of the L number of first amplifier circuits in electrical connection with and proximate to one of the L number of monitor photodiodes integrated in the first laser diode driver IC chip; and an M number of second amplifier circuits integrated in the second laser diode driver IC chip, each of the M number of second circuits in electrical connection with and proximate to one of the M number of monitor photodiodes integrated in the second laser diode driver IC chip.

8. The parallel optical transceiver module of claim 2, wherein the first and second sets of monitor photodiodes comprise at least N monitor photodiodes, the N monitor photodiodes monitoring respective ones of the N optical signals generated by the N laser diodes, respectively.

9. The parallel optical transceiver module of claim 2, wherein the laser diodes of the laser diode IC chip are arranged in a 1-by-N array, and wherein L and M are equal such that each laser diode driver IC chip drives exactly N/2 of the laser diodes.

10. The parallel optical transceiver module of claim 9, wherein N is equal to or greater than twelve.

11. The parallel optical transceiver module of claim 2, wherein the upper surface of the circuit board has a leadframe thereon, the leadframe comprising an electrically conductive material, and wherein the first and second laser diode driver IC chips and the laser diode IC chip are mounted on the leadframe, the leadframe having at least first and second slots that have been formed therein by removing portions of the electrically conductive material of the leadframe, the slots passing entirely through the leadframe from an upper surface of the leadframe through a lower surface of the leadframe, and wherein the first slot is located between the first side of the first laser diode driver IC chip and the first side of the laser diode IC chip, and the second slot is located in between the first side of the second laser diode driver IC chips and the second side of the laser diode IC chip.

12. A method for simultaneously transmitting multiple optical signals over multiple respective optical transmit channels in a parallel optical transceiver module, the method comprising:
   causing a first set of electrical laser diode driver signals to be sent over a first set of conductors of a first laser diode driver IC chip mounted on an upper surface of a substrate to a laser diode IC chip mounted on the upper surface of the substrate, the laser diode IC chip comprising N laser diodes configured to generate a N respective optical signals travelling in a direction away from the upper surface of the substrate, wherein N is an integer that is equal to or greater than 2, the first laser diode driver IC chip having driver circuitry configured to drive L of the N laser diodes, wherein L is an integer that is less than N and greater than or equal to 1; and
   causing a second set of electrical laser diode driver signals to be sent over a second set of conductors of a second laser diode driver IC chip mounted on the upper surface of the substrate to the laser diode IC chip, wherein the second laser diode driver IC chip has driver circuitry configured to drive M of the N laser diodes, wherein M is an integer that is less than N and greater than or equal to 1, wherein the first and second sets of electrical laser diode driver signals sent over the first and second sets of conductive pathways from the first and second laser diode driver IC chips to the laser diode IC chip cause the N laser diodes of the laser diode IC chip to generate the N optical signals;
   wherein the laser diode IC chip is located in between the first and second laser diode driver IC chips such that: a first side of the first laser diode driver IC chip is proximate to a first side of the laser diode IC chip; and a first side of the second laser diode driver IC chip is proximate to a second side of the laser diode IC chip,
   wherein the first laser diode driver IC chip has a first set of monitor photodiodes integrated therein, the first set of monitor photodiodes comprising at least one monitor photodiode, said at least one monitor photodiode of the first set of monitor photodiodes being positioned in close proximity to the first side of the first laser diode driver IC chip, and wherein the second laser diode driver IC chip has a second set of monitor photodiodes integrated therein, the second set of monitor photodiodes comprising at least one monitor photodiode, said at least one monitor photodiode of the second set of monitor photodiodes being positioned in close proximity to the first side of the second laser diode driver IC chip.

13. The method of claim 12, wherein:
   the first laser diode driver IC chip contains L first signal pathways configured in parallel running between the first side of the first laser diode driver IC chip and the second side of the first laser diode driver IC chip where each of the L first signal pathways is about 500 microns in width; and
   wherein the second laser diode driver IC chip contains M second signal pathways configured in parallel running between the first side of the second laser diode driver IC chip and the second side of the second laser diode driver IC chip where each of the M second signal pathways is about 500 micrometers in width.

14. The method of claim 13, wherein each of the L first signal pathways of the first laser diode driver IC chip is in communication with one of the L of the N laser diodes driven by the first laser driver IC chip, and each of the M second signal pathways of the second laser diode driver IC chip is in communication with one of the M of the N laser diodes driven by the second laser driver IC chip.

15. The method of claim 14, wherein:
   the first set of monitor photodiodes comprises L number of monitor photodiodes, and each of the L number of monitor photodiodes is located within one of the L first signal pathways of the first laser diode driver IC chip; and
   the second set of monitor photodiodes comprises M number of monitor photodiodes, and each of M number of monitor is located within one of the M second signal pathways of the second laser diode driver IC chip.

16. The method of claim 15, further including:
   a first set of amplifier circuits integrated in the first laser diode driver IC chip, each of first set of amplifier circuits in electrical connection with and proximate to one of the L number of monitor photodiodes integrated in the first laser diode driver IC chip; and
   a second set of amplifier circuits integrated in the second laser diode driver IC chip, each of second set of amplifier circuits in electrical connection with and proximate to one of the M number of monitor photodiodes integrated in the second laser diode driver IC chip.

17. The method of claim 12, wherein the first and second sets of monitor photodiodes comprise at least N monitor photodiodes, the N monitor photodiodes monitoring respective ones of the N optical signals generated by the N laser diodes, respectively.

18. The method of claim 17, wherein N is equal to or greater than twelve.

19. The method of claim 12, wherein the laser diodes of the laser diode IC chip are arranged in a 1-by-N array, and wherein L and M are equal such that each laser diode driver IC chip drives exactly N/2 of the laser diodes.

20. The method of claim 12, further comprising providing a leadframe on the upper surface of the substrate, the leadframe comprising an electrically conductive material, and wherein the first and second laser diode driver IC chips and the laser diode IC chip are mounted on the leadframe, the leadframe having at least first and second slots that have been formed therein by removing portions of the electrically conductive material of the leadframe, the slots passing entirely through the leadframe from an upper surface of the leadframe through a lower surface of the leadframe, and wherein the first slot is located between the first side of the first laser diode driver IC chip and the first side of the laser diode IC chip, and the second slot is located in between the first side of the second laser diode driver IC chips and the second side of the laser diode IC chip.

* * * * *